(12) United States Patent
Gao

(10) Patent No.: US 11,818,866 B2
(45) Date of Patent: Nov. 14, 2023

(54) ELECTRONIC RACK CONTROL SYSTEM FOR CLOUD SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 67 days.

(21) Appl. No.: 17/353,709

(22) Filed: Jun. 21, 2021

(65) Prior Publication Data

US 2022/0408596 A1 Dec. 22, 2022

(51) Int. Cl.
*H05K 7/20* (2006.01)
*H05K 7/14* (2006.01)

(52) U.S. Cl.
CPC ....... *H05K 7/20281* (2013.01); *H05K 7/1492* (2013.01); *H05K 7/20272* (2013.01); *H05K 7/20781* (2013.01)

(58) Field of Classification Search
None
See application file for complete search history.

(56) References Cited

U.S. PATENT DOCUMENTS

| 2016/0270259 A1* | 9/2016 | Chainer | G01M 3/3227 |
| 2022/0071049 A1* | 3/2022 | Heydari | H05K 7/20781 |
| 2022/0110223 A1* | 4/2022 | Heydari | H05K 7/20836 |
| 2022/0151114 A1* | 5/2022 | Heydari | H05K 7/20272 |

* cited by examiner

*Primary Examiner* — Courtney L Smith
(74) *Attorney, Agent, or Firm* — WOMBLE BOND DICKINSON (US) LLP

(57) ABSTRACT

According to one embodiment, a control system for a rack that includes a RMC that is communicatively coupled to pieces of equipment, each piece of equipment including a leak sensor and is fluidly coupled to a rack liquid manifold that circulates liquid coolant through the piece of equipment, several switches, and a control device that has a memory storage device that includes several of switch control and operation configurations, where in response to the RMC receiving a leak signal from a leak sensor, the control device determines each switch configuration based on the leak sensor from which the leak signal is received, and sets the switches in the configuration in which each of one or more switches, including a switch that controls the flow of coolant into the piece of equipment, exit the equipment, and prevents coolant from flowing from the manifold into a respective piece of equipment.

20 Claims, 5 Drawing Sheets

ELECTRONIC RACK CONTROL SYSTEM FOR CLOUD SERVERS

FIELD

Embodiments of the present disclosure relate generally to a control system that provides fluid and power management for pieces of information technology (IT) equipment (e.g., cloud servers) of an electronic rack.

BACKGROUND

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs).

Thermal management for a data center that includes several active electronic racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environ neat is to liquid cool the IT equipment. For instance, equipment may include cold plates on which processors are mounted within the equipment. Cooling liquid is passed through the cold plates in order to transfer heat away from the active processors.

With fluid flowing through liquid cooling equipment, such as tubes, fittings, etc., within the rack, leaks may occur (e.g., due to wear). As a result, fluid may leak onto the electronics (e.g., servers) that are mounted in the rack, and may cause damage (e.g., electrical shorts). Some electronic racks may include leak detection systems, which as a result of detecting a leak will shut down the entire electronic rack in order to avoid damage (e.g., by cutting power to the entire rack). This type of system, however, has drawbacks. For instance, a fluid leak may only affect a small number of pieces of electronic equipment (e.g., the equipment at which the leak has occurred). Although shutting down the rack may preserve this equipment (e.g., by preventing shorts), the majority of equipment that are unaffected are also shut down. As a result, processing services being provided by the majority of equipment would be unnecessarily interrupted once the entire rack is shut down.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
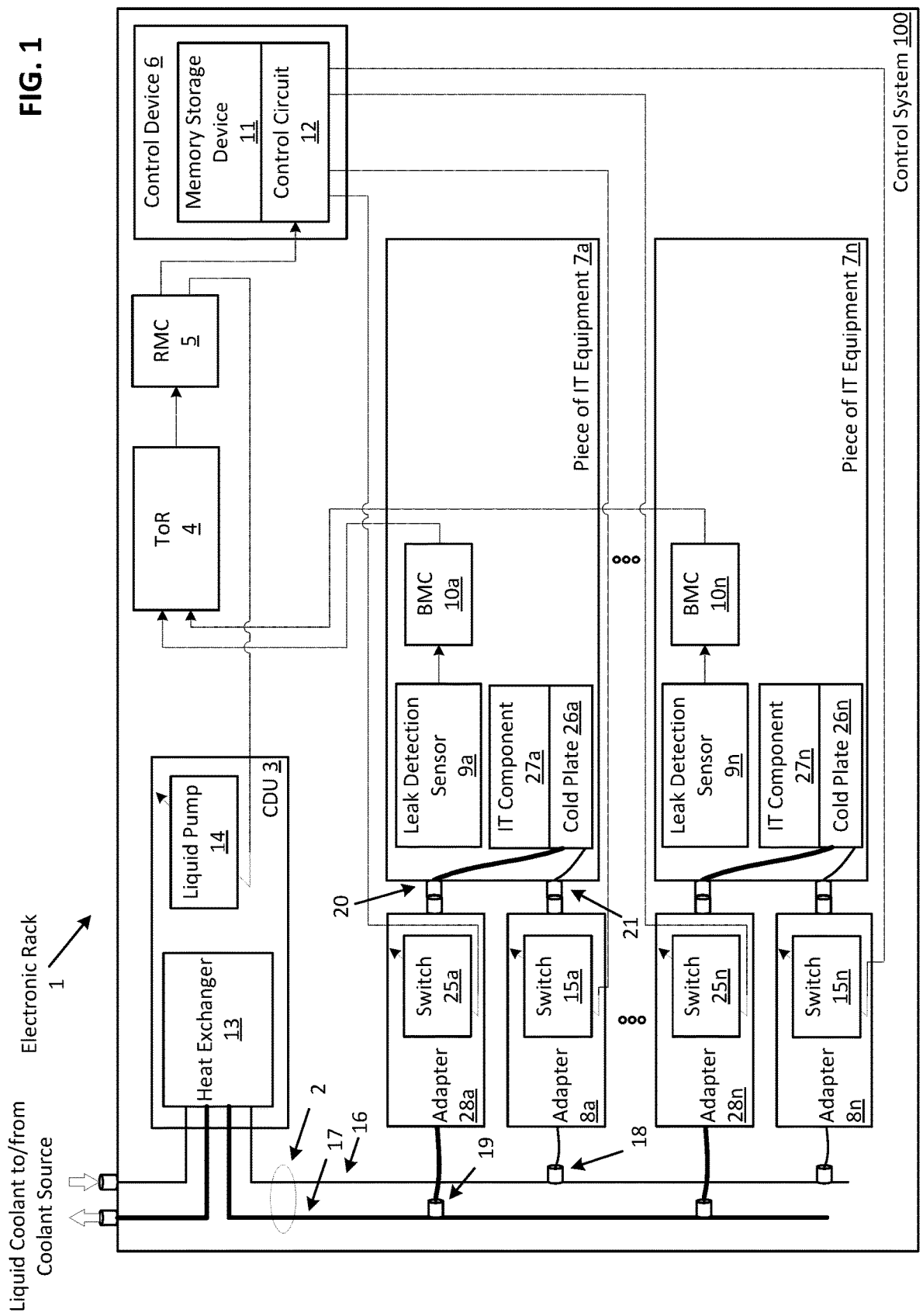
FIG. 1 is a block diagram illustrating an example of an electronic rack that includes a control system for performing fluid management operations based on whether leaks of liquid coolant are detected according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to Obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of dynamically adjusting fluid and power management of a (e.g., high-power density) electronic rack when liquid leaks occur. Traditional racks address this problem by shutting down (e.g., powering down) the entire electronic rack in order to avoid electrical issues. Such a drastic measure may be unnecessary when a liquid leak only affects a minority of electronics within the rack. Thus, various embodiments of the present disclosure describe a control system for (e.g., high-power density) electronic racks, which may be populated within a data center room. The control system includes a configurable control device that can be used in conjunction with a (e.g., existing) rack management controller (RMC) of an electronic rack to provide fluid and power management for pieces of information technology (IT) equipment (e.g., cloud servers) of an electronic rack. For instance, the control system may include switches that each control the flow of liquid coolant into (and/or out of) pieces of liquid-cooled IT equipment within the rack. Unlike existing rack controllers (e.g., RMCs) that only include a logic board (e.g., without control circuits, such as microprocessors and without memory), the control device includes a memory storage device that has a data structure that includes several switch configurations. Once a leak is detected, the control device may be configured to set (e.g., open or close) the switches of the control system to prevent the flow of liquid coolant into pieces of IT equipment that are affected by the leak, while allowing liquid coolant to continue to flow through the rest of the equipment. In addition to, or in lieu of, closing switches to prevent the flow of liquid, the control system may control power switches of pieces of IT equipment in order to disconnect the equipment from a (e.g., direct current (DC)) power source, thereby preserving the equipment from any electrical damage due to the leak. Thus, when liquid leaks occur the control system may mitigate the effects of the leak to data processing of the electronic rack by only shutting down equipment affected by the leak, while continuing to allow other equipment to operate.

In addition, the control system of the present disclosure is dynamically reconfigurable based on the pieces of IT equipment within the electronic rack. For instance, traditional control systems require a hardware level reconfiguration/change (e.g., by a technician) when equipment is added/removed from an electronic rack. Conversely, the control system of the present disclosure may be reconfigured by adjusting switch configurations stored within the memory storage device in response to changes in equipment within the rack. Moreover, the control system of the present disclosure may be dynamically reconfigured based on the operational needs (e.g., workloads) of the pieces of IT equipment. For instance, several pieces of IT equipment within the rack may be performing portions of a data processing service (e.g., providing a cloud-based service). Upon determining that a piece of IT equipment needs to be shut down (e.g., due to a liquid leak), the data processing of other equipment performing similar workloads in a same task (such as a distributed artificial intelligence (AI) training task) may be adversely effected if the piece of IT equipment were to be shut down. As a result, the switch configurations may be dynamically reconfigured based on workloads of IT equipment, such that equipment with similar workloads may be shut down (e.g., while their workloads may be distributed to one or more other pieces of IT equipment, which may occur in a seamless transition) in response to detecting one or more liquid leaks.

According to one embodiment, a control system for an electronic rack includes a RMC that is communicatively coupled to several of pieces of IT equipment that are mounted within the electronic rack, each piece of IT equipment including a leak detection sensor and is fluidly coupled to a rack liquid manifold within the electronic rack that circulates liquid coolant through the piece of IT equipment; several switches, each switch is configured to control a flow of liquid coolant from the rack liquid manifold into one piece of IT equipment of the plurality of pieces of IT equipment; and a control device that is communicatively coupled to the RMC and to the plurality of switches, and includes a memory storage device that has a data structure with several switch configurations for the several switches, wherein, in response to the RMC not receiving a leak detection signal from a leak detection sensor, the control device is configured to set the several switches in a first switch configuration of the several switch configurations that allows liquid coolant to flow from the rack liquid manifold into each piece of IT equipment, wherein, in response to the RMC receiving a leak detection signal from a leak detection sensor of a piece of IT equipment, the control device is configured to: determine a second switch configuration from the several switch configurations based on the leak detection sensor from which the leak detection signal is received, and set the several switches according to the second switch configuration in which each of one or more switches of the several switches, which includes a switch that controls the flow of liquid coolant into the piece of IT equipment, prevents liquid coolant from flowing from the rack liquid manifold into a respective piece of IT equipment.

In one embodiment, each piece of IT equipment is not directly communicatively coupled with its respective switch that controls the flow of liquid coolant into the piece of IT equipment. In another embodiment, the memory storage device is removably coupled to the control device. In some embodiments, each piece of IT equipment of the several pieces of IT equipment includes a power switch that is communicatively coupled to the control device and is configured to electrically connect the piece of IT equipment to a direct current (DC) busbar that supplies DC power when closed. In one embodiment, each switch configuration of the several switch configurations indicates whether each switch of the several switches and each power switch is open or closed, wherein, in response to the RMC receiving the leak detection signal from the leak detection sensor of the piece of IT equipment, the control device opens the one or more switches of the plurality of switches to prevent liquid coolant from flowing from the rack liquid manifold into respective one or more pieces of IT equipment, and opens one or more power switches of the respective one or more pieces of IT equipment. In another embodiment, the control device opens each power switch of the one or more power switches after a respective switch of the one or more switches is opened. In some embodiments, the electronic rack includes a coolant distribution unit (CDU) that is communicatively coupled with the RMC and includes a coolant pump that controls a flow rate of liquid coolant that circulates through the rack liquid manifold, wherein the RMC transmits a control signal to the CDU to increase the flow rate of the liquid coolant after the one or more switches are opened.

In one embodiment, each of the several switch configurations is based on workloads of the plurality of pieces of IT equipment, wherein each respective piece of IT equipment is performing at least a portion of a distributed workload. In another embodiment, the control device is configured to adjust the several switch configurations based on changes to workloads of one or more pieces of IT equipment of the several pieces IT equipment.

According to one embodiment, an electronic rack includes a rack liquid manifold having a supply manifold that receives liquid coolant from a coolant source and a return manifold that returns liquid coolant to the coolant source; several pieces of IT equipment arranged in a stack for providing data processing services, each piece of IT equipment including a leak detection sensor and is fluidly coupled to the supply manifold and the return manifold to circulate liquid coolant through the piece of IT equipment; a RMC that is communicatively coupled to each of the leak detection sensors; and several switches, each switch is communicatively coupled to the RMC and is configured to control a flow of liquid coolant from the rack liquid manifold into a piece of IT equipment of the several pieces of IT equipment, wherein the RMC includes a control circuit that has a memory storage device that includes a data structure with several switch configurations of the several switches, wherein, in response to the RMC not receiving a leak detection signal from a leak detection sensor, the control circuit is configured to set the several switches in a first switch configuration of the several switch configurations that allows liquid coolant to flow from the rack liquid manifold into each piece of IT equipment, wherein, in response to the RMC receiving a leak detection signal from a leak detection sensor of a piece of IT equipment, the control circuit is configured to: determine a second switch configuration from the several switch configurations based on the leak detection sensor from which the leak detection signal is received, and set the several switches in a second switch configuration in which each of the one or more switches of the several switches, which includes a switch that controls the flow of liquid coolant into the piece of IT equipment, prevents liquid coolant from flowing from the supply manifold into a respective piece of IT equipment. In one aspect, the electronic rack includes at least some components of the control system described herein.

A method performed by a RMC of an electronic rack, the method comprising: receiving, by the RMC, a leak detection signal from a leak detection sensor of a piece of IT equipment of several pieces of IT equipment that are mounted within the electronic rack, wherein each piece of IT equipment is fluidly connected to a rack liquid manifold of the electronic rack that circulates liquid coolant through the piece of IT equipment; determining, by a control circuit of the RMC, whether the leak detection signal indicates that the piece of IT equipment has a liquid coolant leak; in response to the control circuit determining that the leak detection signal indicates that the piece of IT equipment has a liquid coolant leak, determining, by the control circuit, that one or more pieces of IT equipment, which include the piece of IT equipment that has the liquid coolant leak, are to be disconnected from the rack liquid manifold based on the leak detection signal by performing a table lookup into a data structure stored within a memory storage device of the RMC that indicates, for each leak detection sensor, which pieces of IT equipment are to be disconnected when a leak detection signal is received; and disconnecting, by the control circuit, the one or more pieces of IT equipment from the rack liquid manifold, while liquid coolant continues to flow through a reminder of several pieces of IT equipment.

In one embodiment, the several pieces of IT equipment are electrically connected to a direct current (DC) busbar that supplies DC power, wherein the method further comprises, in response to determining that the leak detection signal indicates that the piece of IT equipment has a liquid coolant leak, disconnecting, by the control circuit, the one or more pieces of IT equipment from the DC busbar. In some embodiments, wherein the rack liquid manifold comprises a supply manifold that receives liquid coolant from a coolant source and a return manifold that returns liquid coolant to the coolant source, wherein the several pieces of IT equipment are connected to the supply manifold and the return manifold, wherein disconnecting the one or more pieces of IT equipment comprises disconnecting each of the one or more pieces of IT equipment from the supply manifold, wherein the method further comprises after disconnecting the one or more pieces of IT equipment from the supply manifold, increasing a flow rate of liquid coolant circulating through the rack liquid manifold, wherein the one or more pieces of IT equipment are disconnected from the DC busbar a period of time after the flow rate of the liquid coolant has been increased.

In one embodiment, as used herein, "to couple" one component (or element) to another component may refer to "fluidly" coupling the two components so that a fluid (or liquid), such as a cooling liquid or a liquid coolant (or a vapor) may flow between the two components. For example, coupling a first tube to a second tube may couple both tubes together such that the liquid coolant may flow from the first tube into the second tube.

FIG. 1 is a block diagram illustrating an example of an electronic rack 1 that includes a control system 100 for performing fluid management operations based on whether leaks of liquid coolant are detected according to one embodiment. In particular, this figure shows the rack that includes a rack liquid manifold 2, one or more pieces of IT equipment 7a-7n, and control system 100, which includes a coolant distribution unit (CDU) 3, a top-of-rack (ToR) module 4, a RMC 5, a control device 6, one or more (e.g., liquid) supply adapters 8a-8n, and one or more (e.g., liquid) return adapters 28a-28n. In one embodiment, the cooling system (and/or the electronic rack) may include more or less components (or elements) as shown herein. For example, the control system may include less adapters, such as having either only supply adapters or only return adapters, as described herein. In another embodiment, the control system may not include a ToR module. In which case, the RMC may communicate (e.g., directly) to each piece of IT equipment within the rack. More about communication between the components is described herein.

In one embodiment, the pieces of IT equipment 7a-7n may be mounted within the electronic rack and may be arranged in a stack (e.g., where equipment 7a is positioned above equipment 7n). In one embodiment, the electronic rack may include one or more (server) slots that are designed to each contain one or more pieces of IT equipment. Each piece of IT equipment may include one or more IT components 27 (e.g., one or more processors such as central processing units or CPUs and/or graphical processing units (GPUs), memory, and/or storage devices). In one embodiment, IT components may perform data processing tasks, where an IT component may include software installed in a storage device, loaded into the memory, and executed by one or more processors to perform the data processing tasks. In one embodiment, at least one of the pieces of IT equipment may include a cloud server that is configured to perform cloud-based data processing. In another aspect, the piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs or different types of accelerators) managed by the host server. The IT component (e.g., processor) performs computational tasks, which may generate heat. The IT equipment may be air-cooled to transfer the generated heat away from the IT components and into the ambient air.

As described herein, the pieces of IT equipment may be liquid-cooled to transfer heat generated by (e.g., the IT components of the) pieces of IT equipment away from the (e.g., component of the) equipment in order to avoid overheating, which may result in failure. For instance, as illustrated herein, the rack liquid manifold 2 is (e.g., fluidly) coupled to each of the pieces of IT equipment 7a-7n in order to circulate liquid coolant through the pieces of IT equipment. The manifold 2 includes a supply manifold 16 that is arranged to supply liquid coolant to the pieces of IT equipment, and includes a return manifold 17 that receives (e.g., warmed) liquid coolant from the pieces of IT equipment, thus forming a heat-transfer loop for each of the pieces of IT equipment. Specifically, (liquid) connectors of the pieces of IT equipment may be coupled to connectors of the rack liquid manifold to create a liquid coolant supply path (or supply path) through which liquid coolant flows from the supply manifold 16 into the pieces of IT equipment, and a liquid coolant return path (or return path) through which liquid coolant is returned from the pieces of IT equipment into the return manifold. In particular, the supply connector 18 of the supply manifold is coupled to supply connector 21 to create the supply path and a return connector 19 of the return manifold is coupled to a return connector 20 to create the return path, for each piece of IT equipment. In addition, as shown, each piece of IT equipment is coupled to the supply manifold 16 via an adapter 8, which controls the flow of liquid coolant from the supply line 16 into a respective piece of IT equipment, and each piece of IT equipment is coupled to the return manifold 17 via an adapter 28, which controls the flow of liquid coolant from the piece of IT equipment into the return manifold 17. More about the adapters is described herein.

In one aspect, at least some of the liquid connectors may be designed to removably couple to other connectors. For example, as shown, the return connector 19 of the return manifold 17 is coupled to adapter 28a (e.g., via a hose). In one aspect, the hose may include a connector that is removably coupled to connector 19, such that the piece of IT equipment (and/or the adapters) may be disconnected (e.g., by a technician) from the rack liquid manifold by disconnecting connecters from one another. In one aspect, at least some of the connectors may be dripless blind mating quick disconnects.

Each piece of IT equipment 7a-7n includes at least one cold plate 26a-26n that is arranged to mount on an IT component 27a-27n, respectively. For instance, cold plate 26a is mounted on IT component 27a of IT equipment 7a. In another embodiment, IT components may be arranged to be mounted onto the cold plates. As described herein, each of the pieces of IT equipment is coupled to the rack liquid manifold in order to circulate liquid coolant through the IT equipment. Specifically, the cold plates within the pieces of IT equipment are coupled to connectors 20 and 21 in order to circulate liquid coolant through the cold plates, thereby creating the heat-transfer loop, as described herein. For example, referring to equipment 7a, liquid coolant supplied by the supply manifold 16 flows (e.g., through the adapter Sa) into cold plate 26a that is designed to transfer heat generated by IT component 27a mounted therein into the liquid coolant that flows through the cold plate, thereby warming the coolant. The warmed coolant flows out of the piece of IT equipment 7a (e.g., through adapter 28a) and into the return manifold 17. As illustrated herein, each piece of IT equipment has one IT component mounted on one cold plate. In one aspect, a piece of IT equipment may include one or more cold plates fluidly coupled in series and/or parallel), where each cold plate liquid cools one or more IT components, as described herein.

In one embodiment, the electronic rack may include a heat exchanger that is coupled to the rack liquid manifold and the coolant source. Specifically, the CDU 3 includes a heat exchanger 13, which may be a liquid-to-liquid heat exchanger. In one embodiment, the heat exchanger includes a (e.g., primary) loop with inlet and outlet ports (of the electronic rack) having a pair of liquid connectors coupled to external liquid supply/return lines (e.g., lines 532-533 illustrated in FIG. 4) that are coupled to the (e.g., external) coolant source to form the primary loop. In addition, heat exchanger 13 is coupled (e.g., using two ports having a pair of liquid connectors coupled) to the rack liquid manifold 2 to form one or more (e.g., secondary) heat-transfer loops with each of the pieces of IT equipment 7a-7n, as described herein. Thus, the heat exchanger may transfer heat from the warmed liquid coolant received through the return manifold 17 into liquid coolant (which is separate from liquid coolant within the one or more secondary heat-transfer loops) circulating through the primary loop.

In one embodiment, the CDU 3 may also include additional components. For instance, as illustrated, the CDU includes a liquid pump 14 that is configured to control a liquid flow rate of liquid coolant supplied to the rack liquid manifold 2 to be distributed to at least some of the pieces of IT equipment 7a-7n. In one embodiment, the CDU may also include a liquid reservoir that is designed to hold (or store) liquid coolant, a power supply (e.g., that is configured to power the liquid pump 14), and/or monitoring sensors and so on. More about the CDU is described herein.

Figure 2:
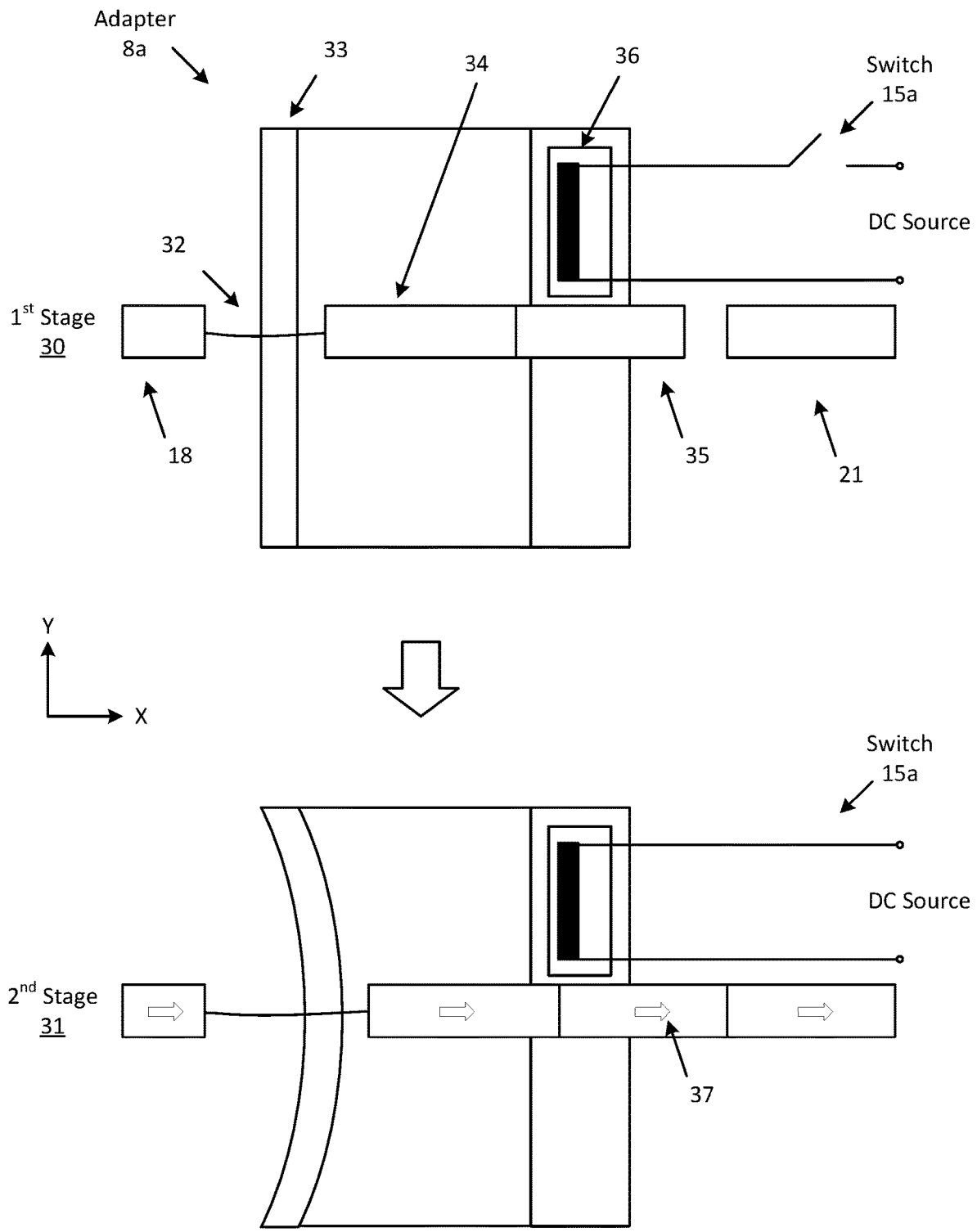
FIG. 2 shows several stages in which a liquid adapter engages with a connector of a piece of information technology (IT) equipment when a switch is closed according to one embodiment.

As shown, the pieces of IT equipment 7a-7n are coupled to supply adapters 8a-8n and return adapters 28a-28n, respectively, and are therefore circulating liquid coolant. Specifically, each of the supply adapters is coupled between the supply manifold 16 and a respective piece of IT equipment, along a liquid coolant supply path in which liquid coolant flows from the supply manifold, through the adapter, and into the piece of IT equipment, and each of the return adapters is coupled between the return manifold 17 and a respective piece of IT equipment, along a liquid coolant return path in which the liquid coolant flows from the piece of IT equipment, through the adapter, and into the return manifold, as described herein. In one embodiment, at least one of the supply and/or return adapters may be configured to such that they disconnected from their respective pieces of IT equipment in order to either prevent liquid coolant from flowing into or out of the pieces of IT equipment, based on whether switches 15a-15n of adapters 8a-8n and/or switches 25a-25n of return adapters 28a-28n are opened or closed. To illustrate, FIG. 2 shows two stages 30 and 31 in which adapter 8a engages (e.g., becomes fluidly coupled) with a connector 21 of piece of IT equipment 7a when switch 15a is closed according to one embodiment. Each stage shows that the adapter 8a includes a hose 32 that is fluidly coupled to connector 18 of the supply manifold 17, a spring 33, an electromagnet 36, a liquid connector 35, a fluid channel 34 that is fluidly coupled between the hose 32 and the connector 35, and switch 15a. In one embodiment, the switch may be separate from the adapter 8a (e.g., a part of a separate electronic device that is electrically coupled to the electromagnet).

The first stage 30 shows that the adapter 8a is disconnected from connector 21 (thereby preventing the flow of liquid coolant into the piece of IT equipment 7a), when the switch 15a is open. The second stage 31 shows that switch 15a has been closed, thereby creating a complete circuit between the electromagnet 36 and the DC source. With the circuit complete, the electromagnet is activated and as a result, draws the spring 33 towards the electromagnet (e.g., in the positive X-direction). As a result, the spring is flexing (e.g., creating a convex shape in the positive X-direction), which draws the connector 35 towards connector 21, coupling both connectors to one another. Once connected, the liquid coolant 37 begins to flow from the connector 18, through the hose 32, the fluid channel 24, the connector 35 and into the piece of IT equipment 7a via connector 21. Thus, the switch 15a is configured to control a flow of liquid coolant from the rack liquid manifold 2 into the (e.g., one)

piece of IT equipment 7a, and thus when closed the piece of IT equipment 7a is fluidly coupled to the rack liquid manifold 2 of the electronic rack 1.

In one embodiment, the adaptor 8a may be designed to removably couple to one or more pieces of IT equipment in order to control the flow of liquid coolant through the equipment. For instance, the adapter may include a manifold to which one or more pairs of connectors (e.g., 20 and 21) may be coupled in order to fluidly couple to one or more pieces of IT equipment.

In one embodiment, once the switch 15a is opened, the circuit between the electromagnet 36 and the DC source is broken. As a result, the magnetic attraction that was drawing the spring 33 towards the magnet ceases, and the spring 33 returns to its original shape and thereby disconnecting connector 35 from connector 21, as shown in the first stage 30.

In one embodiment, the return adapters 28a-28n may operate similarly to supply adaptors 8a-8n. For instance, in response to switch 25a being closed a connector of adapter 28a may (removably) couple to connector 20 in order to create the liquid coolant return path, as described herein. Once the switch 25a is opened, however, the adapter 28a may disconnect from the piece of IT equipment as well. Thus, in one embodiment, the adapters 8a-8n and 28a-28n may be the same (e.g., the same type of adapter).

Although illustrated as being two separate adapters 8a-8n and 28a-28n, in one embodiment the both adapters may be a part of one integrated unit. Specifically, rather than being two separate devices, a single adapter with two pairs of connectors may be used to couple a piece of IT equipment to the rack liquid manifold. In which case, the liquid coolant supply path and the liquid coolant return path may flow through the adapter. In one embodiment, the single adapter may include the two switches (e.g., a single adapter coupling the piece of IT equipment 7a to the manifold 2 may include switch 15a and 25a), thereby allowing the adapter to disconnect the piece of IT equipment from the supply manifold 16 and the return manifold 17, individually. In another embodiment, the single adapter may include a single switch, which when opened disconnects both the liquid supply path and the liquid coolant return path.

As described thus far, the liquid adapters control the flow of liquid coolant by connecting/disconnecting to connectors based on whether their respective switches are open or closed. In another embodiment, an adapter may be any type of device that is designed to control the flow of liquid coolant. For example, one or more adapters may include a (liquid) valve that includes a switch, where its respective switch controls the open ratio of the value (e.g., when the switch is closed, the valve is at least partially open, while when the switch is open the valve is closed). In another embodiment, rather than having two adapters per piece of IT equipment, one adapter may be used. For instance, adapter 8a may be coupled between the supply manifold 16 and the piece of IT equipment 7a, whereas a hose may be coupled between the return manifold 17 and the equipment.

Returning to FIG. 1, the pieces of IT equipment 7a-7n include additional elements, specifically leak detection sensors 9a-9n and board management controllers (BMCs) 10a-10n, respectively. In one embodiment, the leak detection sensors may be any type of sensor that is designed to detect a liquid leak (e.g., liquid coolant leak) within a piece of IT equipment. In one aspect, the leak sensors may be integrated within (e.g., on a printed circuit board (PCB) within a housing of the IT equipment. In another aspect, the leak sensors may be positioned such that they sense leaks outside of their respective pieces of IT equipment (e.g., disposed on the housing of the IT equipment). In another embodiment, a piece of IT equipment may include one or more leak detection sensors (e.g., at least one inside a housing of the equipment and/or at least one outside). In another aspect, the leak detection sensor may be (e.g., a part of) a separate electronic device that is communicatively coupled with (e.g., a BMC of) the piece of IT equipment.

In one embodiment, the BMCs 10a-10n may be configured to communicate with one or more IT components of respective pieces of IT equipment 7a-7n. For instance, BMC 10a may be communicatively coupled with the leak detection sensor 9a, and may be configured to receive a leak detection sensor signal from sensor 9a (e.g., which may be produced by the sensor in response to detecting a leak of liquid coolant). In one aspect, the BMC may be coupled to other components, such as the IT components 27. In which case, the BMC may receive data regarding operations performed by the IT component. For instance, the BMC may receive workload information (data processes being performed by the IT component, etc.), while (or before) the IT component performs the workload. As described herein, the BMC may transmit at least some of this data (e.g., workload information) to one or more components (e.g., the control device 6) of the control system 100.

The ToR module 4 is one or more network switches, such as Ethernet switches, that operate as access layer switches (e.g., Layer 2 switches) to connect one or more pieces of IT equipment 7a-7n (e.g., as end node devices) to a network (e.g., the Internet). As shown, the ToR is communicatively coupled with each of the BMCs 10a-10n, which are configured to transmit data to the ToR. In one aspect, the BMCs may forward leak detection signals produced by their respective leak detection sensors.

The RMC 5 may be a logic circuit that is communicatively coupled to the pieces of IT equipment 7a-7n (e.g., via the ToR 4) to receive data from one or more of the pieces of IT equipment. In one aspect, the RMC includes a monitor to monitor operating status of various components within the electronic rack, such as, for example the pieces of IT equipment 7a-7n, and the CDU 3. Specifically, the monitor may receive operating data (e.g., sensor signals) from various sensors (e.g., the leak detection sensors 9, temperature sensors, etc.) representing the operating environment of the electronic rack. For instance, the monitor may receive operating data representing temperatures of the processors, cooling liquid, air flows, which may be captured and collected via various temperature sensors, and receive leak detection signals, which indicate whether a leak is detected (e.g., based on whether the signal is in a high state). Based on this data, the logic circuit of the RMC may perform some operations. For instance, the RMC may be communicatively coupled to the CDU, and the RMC may be configured to adjust the flow of liquid coolant by configuring the liquid pump 14 according to the temperature sensor data.

As described herein, the RMC may include a logic circuit, which is designed to perform logical operations based on particular input (e.g., based on the data received from the BMCs of the pieces of IT equipment). In one embodiment, the RMC may not include IT components that enable additional processing. For example, the RMC may not include a control circuit (e.g., a processor, such as a central processing unit (CPU), etc.) that enable a computing capability. In another embodiment, the RMC may not a memory storage device, such as random access memory (RAM), read only memory (ROM), and/or any other type of memory (e.g., a hard drive, etc.). Thus, since the RMC does not include a storage device, it does not store instructions that may be executed by a processor.

The control device 6 includes a memory storage device 11 and a control circuit 12, and is a separate electronic device from the RMC. The control device is communicatively coupled with the (e.g., switches 15a-15n of the) adapters 8a-8n, the (e.g., switches 25a-25n of the) adapters 28a-28n, and is communicatively coupled with the RMC, and is configured to receive data of the pieces of IT equipment 7a-7n from the RMC. More about the communication between the control device and at least some of the switches is described herein.

In one embodiment, the memory storage device may be any type of memory that is configured to store data. In one embodiment, the memory storage device may be removably coupled to the (e.g., control circuit 12 of the) control device 6. For instance, the memory storage device may be any type of removable media, such as an optical disc (e.g., CD), a memory card (e.g., a secure digital (SD) card, a memory stick, etc.), a universal serial bus (USB) flash drive, an external hard drive (e.g., a hard disc drive, a solid-state drive (SSD), etc.). In one embodiment, the memory storage device may be configured to store instructions (e.g., software, such as firmware), which may be used by the control circuit to perform fluid and power management operations, as describe herein. In one embodiment, the memory storage device may include a data structure with one or more switch configurations for one or more of the switches 15a-15n and/or 25a-25n, In one embodiment, a switch configuration may indicate whether a switch is open or closed based on one or more criteria (e.g., whether a leak is detected within one or more pieces of IT equipment). In another embodiment, the switch configurations may indicate a timing for changing switch states (e.g., a timing at which a switch is opened based on whether the criteria are satisfied, etc.). More about the switch configurations is described herein.

The control circuit 12 may be any type of integrated circuit, such as a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines), and/or a combination of analog elements (e.g., resistors, capacitors, inductors, etc.) and/or digital elements (e.g., logic-based elements, such as transistors, etc.).

In one embodiment, the control device 6 is configured to perform fluid management operations based on one or more criteria. Specifically, the control circuit 12 of the device is configured to determine a switch configuration of the one or more switches 15a-15n and/or switches 25a-25n (e.g., whether to open or close the switches), in response to the control system detecting a liquid coolant leak (e.g., in one or more pieces of IT equipment), and is configured to control one or more of the switches according to the determined switch configuration (e.g., transmitting a control signal to open a switch of an adapter that controls a flow of liquid coolant into or out of a piece of IT equipment that is determined to have a leak to disconnect the adapter(s) from the equipment's connectors) in order to mitigate (or reduce) an impact of a liquid coolant leak within the electronic rack. Thus, each piece of IT equipment is not directly communicatively coupled with its respective switch(es) that controls the flow of liquid coolant into and/or out of the piece of IT equipment. Instead, the pieces of IT equipment communicate via (e.g., an existing communication channel with) the RMC 5 to transmit data that is used by the control circuit to configure (and reconfigure) switches. This reduces complexity, since existing communication channels are used, rather than each piece of IT equipment being communicatively coupled (e.g., via a wire) to its respective switch. A description of at least some of the operations performed by the control circuit are now described.

For example, in response to a leak detection sensor (e.g., sensor 9a) detecting a leak (e.g., due to a hose supplying the cold plate 26a with liquid coolant failing), the leak detection sensor may produce a leak detection signal and transmit the signal to the RMC 5 (e.g., via BMC 10a and the Top, module 4). The RMC may transmit the signal to the control circuit of the control device, which determines a switch configuration for the switches 15a-15n and/or 25a-25n based on the signal. For instance, the control circuit 12 may retrieve a switch configuration table from the memory storage device that indicates one or more switch configurations. Once retrieved the control circuit may determine a switch configuration for one or more of the switches based on the leak detection signal that indicates that there is a leak, and may set one or more of the switches, according to the switch configuration. The following is an example of a switch configuration table, and operations performed by the control device in response to receiving one or more leak detection signals.

TABLE 1

Switch Configuration

|  | Sensor 1 | Sensor 2 | Sensor 3 | Sensor 4 | Sensor 5 | ... |
|---|---|---|---|---|---|---|
| Switch 1 | 1 | 0 | 0 | 0 | 0 | |
| Switch 2 | 0 | 1 | 0 | 0 | 0 | |
| Switch 3 | 0 | 0 | 1 | 0 | 0 | |
| Switch 4 | 0 | 0 | 0 | 1 | 0 | |
| Switch 5 | 0 | 0 | 0 | 0 | 1 | |
| ... | | | | | | |

The switch configuration table 1 shows five switch configurations (e.g., the five columns), each configuration associated with a leak detection sensor that detects a leak. Specifically, the table shows states of switches 1-5 (e.g., 15a-15e), based on whether the control circuit 12 receives a leak detection signal (e.g., via the RMC) from any of the sensors 1-5 (e.g., sensors 9a-9e). In particular, "1" indicates that a switch is to be opened to prevent the flow of liquid coolant (as shown in the first stage 30 of FIG. 2), while a "0" indicates that a switch is to be closed or to remain closed to allow the flow of liquid coolant from the rack liquid manifold into a respective piece of IT equipment (as shown in the second stage 31 of FIG. 2). This table shows that only switches associated pieces of IT equipment that include the sensor that detects the leak are to be opened. For example, in response to the control circuit 12 receiving a leak detection signal from sensor 1 (e.g., sensor 9a), the control circuit performs a table lookup into the table to identify a switch configuration associated with the sensor 1. Upon performing the lookup, the control circuit selects the first column of switch configurations (since that column is associated with sensor 1), and transmits a control signal to switch 1 (e.g., switch 15a) to open, while the remainder of switches remain closed (or are instructed by the control device to close by transmitting a control signal that closes the switches). As a result, the control circuit may cut off the piece of equipment (e.g., 7a) from the rack liquid manifold in order to reduce the flow of liquid coolant through the equipment and the amount of liquid leaking, while continuing to provide liquid coolant to the other pieces of IT equipment.

In one embodiment, the switch configuration table 1 may also represent the states of switches 25a-25n. For instance, switches 1-5 may also represent states of switches 25a-25e of return adapters 28a-28e. Returning to the previous example, upon sensor 9a detecting a leak, the control circuit selects the first column, and transmits a control signal to switch 15a and 25a to open in order to disconnect the piece of IT equipment 7a from the supply manifold 16 and the return manifold 17. In some embodiments, the control circuit may control switches of a pair of adapters associated with a piece of IT equipment (such as adapters 15a and 25a) individually, and/or at different periods of time. For instance, the control circuit may open switch 15a, before switch 25a in order to cut the supply of liquid coolant to the piece of IT equipment first and then to drain out any existing liquid coolant before opening switch 25a in order to disconnect the equipment from the return path. More about controlling adapters at different times is described herein. In another embodiment, the switches may be controlled simultaneously.

As described thus far, the control device is configured to set one or more switches in a switch configuration based on whether a leak detection signal is received from one sensor. In one embodiment, the control device may determine one or more configurations based on receiving one or more leak detection signals. For instance, referring to table 1, upon receiving a leak detection signal from sensors 1 and 3, the control device may select switch configurations corresponding to columns 1 and 3. Once selected, the control device may open switches that include a "1", which in this case are switches 1 and 3. In another embodiment, the control device may be configured to set the switches in a configuration in response to not receiving a leak detection signal from a sensor. In this case, the control device may close (all of) the switches in order to allow liquid coolant to flow into each of the pieces of IT equipment. In one embodiment, the determination of which switches are closed may be based on whether the electronic rack is populated with a piece of IT equipment corresponding to a switch. For instance, if a piece of IT equipment is not installed in a slot that corresponds to switch 1, the switch may remain open, regardless of whether a leak detection signal is detected.

In one embodiment, other operations may be performed to manage liquid distribution throughout the pieces of IT equipment. For example, the control device may be configured to adjust the pump speed of the liquid pump 14. In one aspect, the adjustment may be in response to a detection of a leak in one or more pieces of IT equipment. For instance, the control device may be configured to transmit a control signal to the RMC, which routes (or transmits) the control signal to the (e.g., liquid pump 14 of the) CDU 3 to increase the flow rate of liquid coolant within the secondary heat-transfer loops (e.g., increasing the flow rate of liquid coolant within the rack liquid manifold 2) by increasing the pump speed of the liquid pump. In one aspect, the control signal may be transmitted after one or more switches of supply adapters have been opened, such that liquid coolant may be drained out of pieces of IT equipment that have been affected by the leak. Specifically, as described herein, when a switch is of a supply adapter (e.g., 8a) is opened, the adapter may shut off the flow of liquid coolant from the supply manifold 16 into a respective piece of IT equipment, while liquid coolant may continue to flow out of the piece of IT equipment, through adapter 28a, into the return manifold 19. Thus, once a switch is opened, the pump speed may be increased in order to drain liquid coolant from the piece of IT equipment as fast as possible. In one embodiment, the pump speed may be increased for a predefined period of time. In another aspect, the increase in pump speed may be based on the number of switches that have been opened (e.g., the more switches that are opened, the faster the pump speed is increased). After the period of time, the pump speed may be decreased (e.g., to a normal operational speed). In some embodiments, once that period of time has expired, the control device may open switch 25a in order to completely disconnect the piece of IT equipment from the rack liquid manifold 2.

As described herein, the control system 100 and/or the electronic rack 1 may include more or less elements. In one aspect, the rack may include one or more valves that are designed to control the flow of liquid coolant. For example, a valve may be disposed along the return path between a piece of IT equipment and the return manifold 17. In one embodiment, the control device may be communicatively coupled with the valve, and may be configured to close the valve under certain situations. Specifically, the control device may close valves of return paths of pieces of IT equipment that have been disconnected from the rack liquid manifold, as described herein, Specifically, the control device may close valves once liquid coolant has been pumped out of respective pieces of IT equipment, as described herein, in order to prevent liquid coolant from flowing back into the piece of IT equipment from the return manifold 17.

Although some components are illustrated as being separate from one another, one or more components may be a part of (or integrated with) other components. In one embodiment, the adapters may be a part of (or integrated into a housing of) its respective piece of IT equipment. In another embodiment, the control device may be a part of (or integrated into) t RMC, 5, as described in FIG. 4.

In one embodiment, the control system may not include a CDU 3. In which case, the rack liquid manifold 2 may be coupled (e.g., directly) to a liquid coolant source (e.g., a data center's cooling liquid system). Specifically, the rack liquid manifold may couple to connectors of the electronic rack that may be coupled (e.g., via a return line and a supply line), to a coolant source (e.g., the data center's cooling liquid system). As a result, the supply manifold 16 may receive (e.g., cooled) liquid coolant from the coolant source, while the return manifold 17 returns the warmed liquid coolant back to the coolant source, which may cool the coolant to be supplied back to the supply manifold. Although the rack may not include the CDU, the rack may still include one or more liquid pumps that control the flow of liquid coolant through the rack manifold, which may be controlled by the RMC 5 (and/or the control device 6), as described herein.

Figure 3:
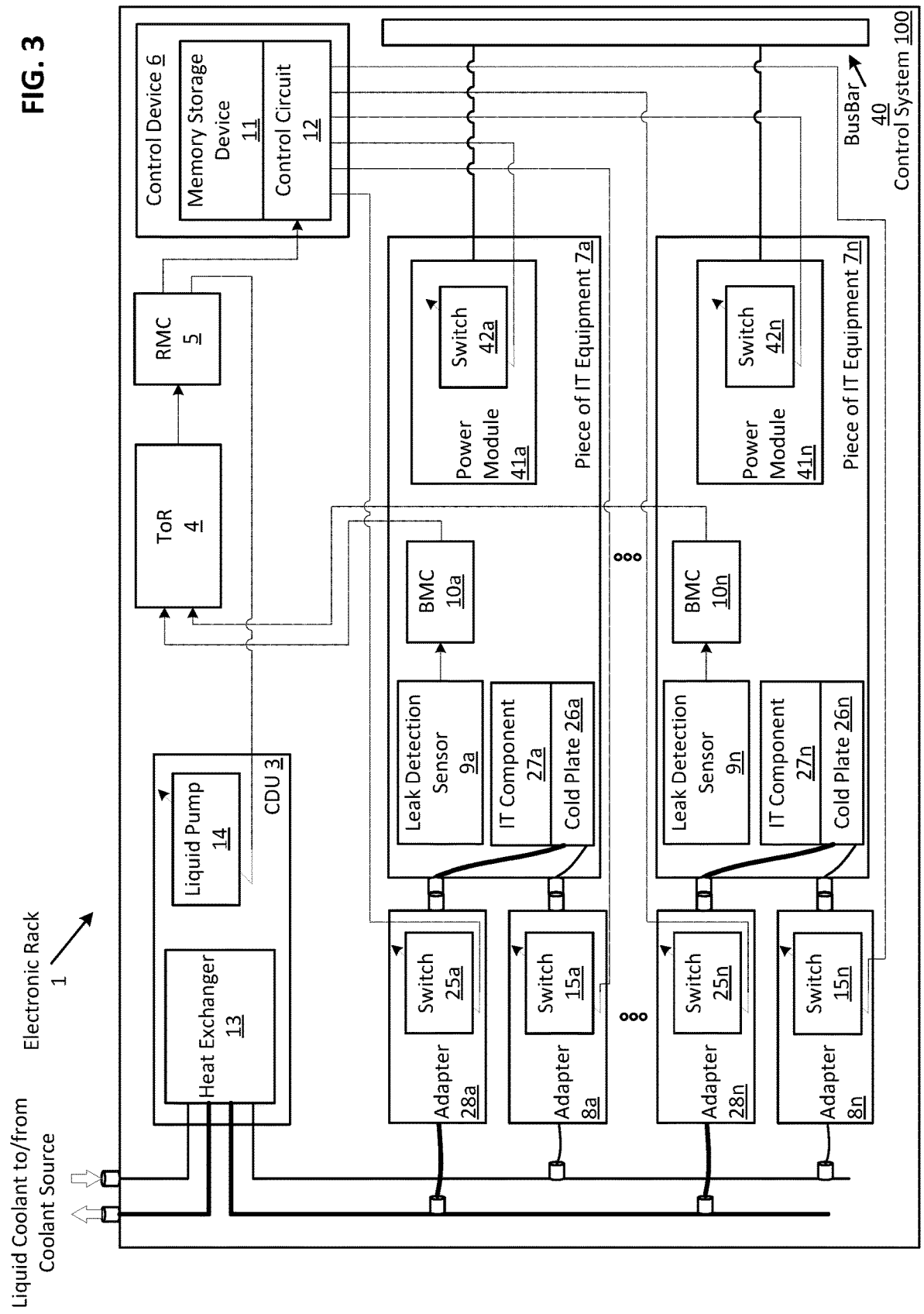
FIG. 3 is a block diagram illustrating an example of an electronic rack that includes a control system for performing fluid and power management operations based on whether leaks of liquid coolant are detected according to one embodiment.

FIG. 3 is a block diagram illustrating an example of the electronic rack 1 that includes the control system 100 for performing fluid and power management operations based on whether leaks of liquid coolant are detected according to one embodiment. As shown, this figure shows that the pieces of IT equipment 7a-7n are electrically connected to a direct current (DC) busbar 40 that is electrically coupled to a DC source (e.g., a battery, a converter (e.g., an AC-to-DC converter, etc.) that supplies DC power to the equipment. Specifically, the pieces of IT equipment 7a-7n include power modules (or power boards) 41a-41n, respectively, where each power module is a component that is designed to draw DC power from the busbar, and provide the power to (e.g., one or more IT components of) its respective piece of IT equipment. As shown, each of the power modules 41a-41n is electrically connected (or coupled) to one busbar 40, from which power is drawn. In another embodiment, at least some of the power modules may be coupled to one or more different busbars, where each busbar may provide different power levels (e.g., where each may have a different supply voltage).

In addition, the power modules 41a-41n include (e.g., power) switches 42a-42n, respectively, where each power switch is communicatively coupled to the (control circuit 12 of the) control device 6, which is configured to control the power switches. In one embodiment, the power switches are configured to regulate the DC current that flows from the busbar 40 into their respective power modules. In particular, when the switches are closed, the circuit is complete the busbar supplies DC power by allowing current to flow from the busbar into the power module, which in turn powers the piece of IT equipment. Conversely, when the power switch is open, the flow of current is interrupted, thereby shutting off the flow of current to shut off the its respective piece of IT equipment.

As described thus far, the control device 6 is configured to perform fluid management operations by setting switches 15a-15n and/or switches 25a-25n in a switch configuration according to whether a leak is detected. In addition, the control device may perform power management operations by controlling switches 42a-42n according to the same (or different) criteria. Specifically, the switch configurations stored in the memory storage device may indicate whether one or more switches 15a-15n, one or more switches 25a-25n, and one or more switches 42a-42n are to be opened or closed in response to receiving one or more leak detection signals from one or more leak detection sensors 9a-9n. As a result, along with preventing the flow of liquid coolant through pieces of IT equipment, the control device may shut power off pieces of IT equipment in order to prevent issues that may occur due to leaks (e.g., electrical shorts).

For example, referring to Table 1, the states of switches 1-5 may correspond to groups of switches 1-5, where each group includes a switch that controls the flow of liquid coolant into a piece of IT equipment (e.g., switch 15a), a switch that controls the flow of liquid coolant out of the piece of IT equipment (e.g., switch 25a), and another switch that controls the flow of current into the same piece of IT equipment (e.g., switch 42a). In which case, the values may represent switch states of both types of switches that are to be set by the control device 6 in response to receiving a leak detection signal. For example, upon receiving a signal from sensor 1 (e.g., sensor 9a), the control device may transmit a control signal to switches 15a and 25a to open, as well as transmitting a control signal to switch 42a to open, while the remaining switches remain closed.

In one embodiment, other switch configurations are possible for controlling the switch states of both the liquid switches and power switches based on whether a leak is detected. For example, the control device may configure one or more (groups of) switches to open in response to receiving a leak detection signal from at least one sensor.

TABLE 2

| | Switch Configuration | | | | |
|---|---|---|---|---|---|
| | Sensor 1 | Sensor 2 | Sensor 3 | Sensor 4 | Sensor 5 ... |
| 1$^{st}$ Group of Switches | 1 | 0 | 0 | 0 | 0 |
| 2$^{nd}$ Group of Switches | 1 | 1 | 0 | 0 | 0 |
| 3$^{rd}$ Group of Switches | 1 | 1 | 1 | 0 | 0 |
| 4$^{th}$ Group of Switches | 1 | 1 | 1 | 1 | 0 |
| 5$^{th}$ Group of Switches | 1 | 1 | 1 | 1 | 1 |
| ... | | | | | |

Table 2 shows several switch configurations for different groups of switches. In one aspect, each group of switches may include one or more liquid switches and/or one or more power switches of a particular piece of IT equipment. For example, the 1$^{st}$ group of switches may include switches 15a, 25a, and 42a that are associated with the piece of IT equipment 7a. As shown in table 2 above, when receiving a leak detection signal from a sensor, the control device opens switches associated with the sensor, as well as other switches below that switch. For instance, in this configuration, each group of switches may be associated with a position of a corresponding piece of IT equipment arranged in a (e.g., vertical) stack within the electronic rack. For example, as previously described, the 1$^{st}$ group of switches may be associated with the piece of IT equipment 7a that may be the highest equipment with respect to the other pieces of equipment (e.g., 7b-7n) positioned in the stack. Each sequentially numbered group of switches and corresponding sensor may be positioned below an earlier numbered group of switches and sensors within the stack, while being above later sequential numbered groups of switches and sensors in the stack. Thus, switch 2 may be switch 15b that is below switch 15a, but above switch 15c. As an example, in response to receiving a leak detection signal from sensor 1, the control circuit 12 transmits control signals to each of the groups of switches, namely of the switches 15a-15n to open (or to remain open), in order to prevent liquid coolant from flowing from the rack liquid manifold into all of the pieces of IT equipment, switches 25a-25n to open (or to remain open), in order to prevent liquid coolant from flowing into the rack liquid manifold from all of the pieces of IT equipment, and switches 42a-42n are opened (or remain open), in order to shut down the pieces of IT equipment. Thus, the switch configurations of table 2, disconnect pieces of IT equipment from the rack liquid manifold 2 and the busbar 40 that are below and including the piece of IT equipment at which the leak is detected. These switch configurations may help preserve pieces of IT equipment (e.g., from water damage) that are positioned below a location where the liquid leak has been detected.

In one embodiment, switch configurations may be based on one or more criteria. For example, switch configurations may be based (current or existing) workloads of (e.g., data processing operations currently being executed by) one or more pieces of IT equipment.

TABLE 3

Switch Configuration

| | Sensor 1 | Sensor 2 | Sensor 3 | Sensor 4 | Sensor 5 | ... |
|---|---|---|---|---|---|---|
| $1^{st}$ Group of Switches | 1 | 0 | 0 | 0 | 0 | |
| $2^{nd}$ Group of Switches | 1 | 1 | 0 | 0 | 0 | |
| $3^{rd}$ Group of Switches | 1 | 1 | 1 | 0 | 0 | |
| $4^{th}$ Group of Switches | 1 | 0 | 0 | 1 | 0 | |
| $5^{th}$ Group of Switches | 1 | 0 | 0 | 1 | 1 | |
| ... | | | | | | |

Table 3 illustrates different switch configurations, in which groups of switches associated with one or more pieces of IT equipment that are performing at least a portion of a distributed workload between the pieces of IT equipment are opened in response to a leak detection sensor of at least one of the pieces of IT equipment detecting a leak. In one embodiment, one or more pieces of IT equipment may distribute a workload such that each piece of IT equipment is to perform at least a portion of data processing operations of one or more related tasks. For example, two pieces of IT equipment associated with the $2^{nd}$ and $3^{rd}$ groups of switches may each be performing a portion of a distributed workload. Thus, in response to the control device receiving a leak detection signal from sensor 2, both groups of switches may be opened.

In one embodiment, switches of one or more pieces of IT equipment that are performing operations of a distributed workload may be opened in response to a sensor of one particular piece of IT equipment detecting a leak for various reasons. For instance, when distributing a workload, several pieces of IT equipment may be required to perform specific operations. If a leak is detected, it may not be possible to shut down (e.g., open associated switches of) some of the pieces of IT equipment (e.g., the piece of IT equipment that has the leak), while continuing to perform the workload. For instance, since some pieces of IT equipment are to be shut down, it may be difficult to seamlessly transition their tasks to other available pieces of IT equipment. In addition, when distributing a workload, one of the pieces of IT equipment may be a network workload distribution manager, which is distributing tasks among one or more other pieces of IT equipment. Distribution managers may be essential for ensuring that the remainder of the pieces of IT equipment are efficiently and properly performing the distributed workload. If a leak is detected within the distribution manager, however, it may be difficult (e.g., complex) to distribute the distribute manager's responsibilities to another piece of IT equipment. As a result, the control system may open groups of switches for the pieces of IT equipment that are performing a distributed workload, since if only a portion of the pieces of IT equipment were to be shut down, the other pieces of IT equipment will be unable to operate appropriately. For example, the piece of IT equipment associated with the $2^{nd}$ soup of switches may be a distribution manager that distributes tasks to the piece of IT equipment associated with $3^{rd}$ group of switches. Once a leak is detected in sensor 2, the control device may open both groups of switches since. In one embodiment, the control system 100 may reassign tasks that were performed by the one or more pieces of IT equipment to other available pieces of IT equipment, as described herein.

In one embodiment, the control device may implement switch configurations simultaneously, such that when a switch configuration is determined that all switches that are to be opened according to the switch configuration are opened at the same time. In another embodiment, the control device may adjust switch states between one or more switches at different times. Specifically, the control device may open power switches 42a-42n, after respective liquid switches 15a-15n and/or switches 25a-25n are opened. This may allow the pieces of IT equipment that have the leak (or are affected by the leak) to continue to operate for a period of time, before being shut off, which may allow the control system to distribute the IT equipment's workload to other available pieces of IT equipment (e.g., that are not affected by the leak). The IT equipment may continue to operate once its liquid switch 15 is open, due to the existing liquid coolant within the equipment continuing to provide liquid cooling capabilities. As described herein, once the liquid switch 15 is opened, the liquid coolant may be drawn out of the piece of IT equipment by the liquid pump 14. In one embodiment, the power switch may remain closed while liquid coolant remains within the piece of IT equipment in order to continue to draw heat away from IT component. Once the liquid coolant is drained, the control device may open switch 25 and 42 in order to completely disconnect the piece of IT equipment from the bulbar 40 and rack liquid manifold. In one embodiment, the time period between opening liquid switches and corresponding power switches may be predefined. In another embodiment, the period of time may be based on a determination of whether liquid coolant remains within the piece of IT equipment detected by one or more sensors of the piece of IT equipment). Once it is determined that liquid coolant no longer is present within the piece of IT equipment, the equipment may transmit a signal (using the BMC) to the control device, which in response opens the IT equipment's power switch.

As described herein, the RMC may increase pump speed of the liquid pump 14 after opening one or more switches 15a-15n. Upon opening the one or more of the power switches 42-42n and one or more switches 15a-25n (e.g., once the liquid coolant has been drawn out of their respective pieces of IT equipment), the RMC may transmit a control signal to the liquid pump 14 to reduce the pump speed to a normal operational speed, as describe herein.

As described thus far, the control device 6 performs liquid and power management operations based on switch configurations stored within the memory storage device 11, which may be based on workloads of one or more pieces of IT equipment. In one embodiment, the control device may reconfigure (or adjust) switch configurations of switches 15a-15n, switches 25a-25n, and/or switches 42a-42n, based on one or more criteria. For example, the control device may adjust switch configurations based on changes to workloads of one or more pieces of IT equipment. During operation, a piece of IT equipment's BMC may transmit operational data to the control device 6, which indicate the equipment's workload. For instance, this data may indicate whether the equipment is performing a distributed workload with other pieces of IT equipment and/or whether the IT equipment is a distribution manager. Once changes to this data is detected (e.g., detecting that a piece of IT equipment is no longer a distribution manager), the control device may adjust switch configurations. In another embodiment, switch configurations may be reconfigured based on the memory storage device installed within the control device. As describe herein, the memory storage device may be removably coupled to the control device. Thus, upon determining that a different memory storage device has been installed, the control device may be reconfigured with one or more different switch configurations.

In another embodiment, if a single; piece of equipment that is performing a non-distributed workload (e.g., where operations are not distributed amongst other pieces of IT equipment), has a leak, the control system 100 may shut down the piece of IT equipment and distribute the workload to a new group of one or more other pieces of IT equipment. In which case, the control device may create (or reconfigure) a switch configuration based on the new distribution of the workload for the new group of pieces of IT equipment (e.g., (e.g., where if one of the pieces of IT equipment within the group has a leak, the entire group is shut down and the workload is redistributed once more).

Figure 4:
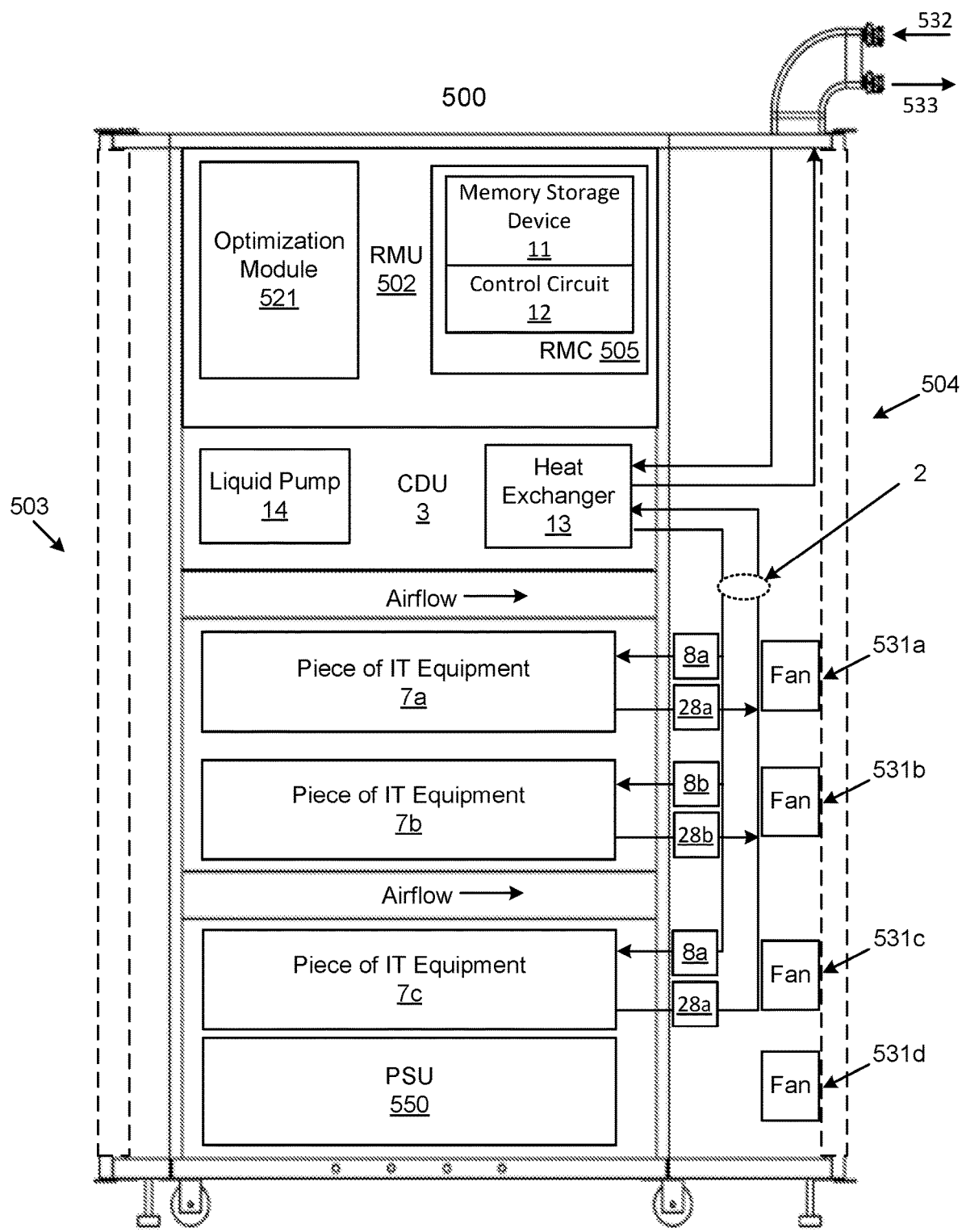
FIG. 4 is an example of an electronic rack according to one embodiment.

FIG. 4 is an example of an electronic rack 500 according to one embodiment. In one embodiment, the electronic rack 500 may include one or more of the same components as rack 1 (e.g., having one or more components of the control system 100), as described herein. Electronic rack 500 may include one or more server slots to contain one or more servers respectively. Each server includes one or more IT components (e.g., processors, memory, storage devices, network interfaces). According to one embodiment, electronic rack 500 includes, but is not limited to, the CDU 3, rack management unit (RMU) 502 (optional), a power supply unit (PSU) 550, and one or more pieces of IT equipment (or IT equipment) 7a-7c, which may be any type of IT equipment, such as server blades, three supply adapters 8a-8c, each of which is configured to control the flow of liquid coolant from the manifold 2 into their respective pieces of IT equipment, and three return adapters 28a-28n, each of which is configured to control the flow of liquid coolant into the manifold. In one embodiment, the IT equipment 7 can be inserted into an array of server slots respectively from frontend 503 or backend 504 of electronic rack 500.

Note that although there are only three pieces of IT equipment 7a-7c shown here, more or fewer pieces of IT equipment may be maintained within electronic rack 500. Also note that the particular positions of CDU 3, RMU 502, PSU 550, and IT equipment 7 are shown for the purpose of illustration only; other arrangements or configurations of these components. may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 7, and the PSU module. In this embodiment, fan modules 531a-531d, collectively referred to as fan modules 531, and are associated with the pieces of IT equipment 7a-7c and the PSU, respectively. Each of the fan modules 531 includes one or more cooling fans. Fan modules 531 may be mounted on the backends of IT equipment to generate airflows flowing from frontend 503, traveling through the rack 500, and existing at backend 504 of electronic rack 500. In another embodiment, one or more of the fan modules may be positioned on the frontend 503 of the rack 500. Such frontend fans may be configured to push air into the mounted equipment.

As described herein, the CDU 3 includes heat exchanger 13, liquid pump 14, and a pump controller (not shown), and some other components such as a liquid reservoir, a power supply, monitoring sensors and so on. Heat exchanger 13 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 504 of electronic rack 500. The liquid supply/return lines 532-533 are coupled to a set of room manifolds, which are coupled to an external heat removal system, or extremal cooling loop. In addition, heat exchanger 13 further includes a second loop with two ports having a second pair of liquid connectors coupled to liquid manifold 2 to form one or more secondary loops, which may include a supply manifold to supply cooling liquid to the pieces of IT equipment 7 and a return manifold to return warmer liquid back to CDU 3. Note that CDU 3 can be any kind of CDU commercially available or customized ones. Thus, the details of CDU 3 will not be described herein.

Electronic rack 500 further includes RMU 502 configured to provide and manage power supplied to servers 7, fan modules 531, and CDU 3. Optimization module 521 and RMC 505 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronic rack 500.

As shown, the RMC 505 includes the memory storage device 11 and the control circuit 12. Specifically, unlike being a part of a separate control device 6 of FIGS. 1 and 3 that is communicatively coupled with the RMC to perform liquid and power management operations, the RMC 505 includes these components, such that the RMC performs at least some of the operations of the control device 6. Thus, these operations may be performed with one device, the RMC, rather than requiring two separate devices. For example, the RMC may be communicatively coupled to sensors 9a-9n, liquid switches 15a-15n, and switches 25a-25n, and/or power switches 42a-42n, where in response to receiving a leak detection signal, the RMC determines a switch configuration based on the sensor from which the signal was received and sets one or more of the switches according to the determined switch configuration in order to 1) open one or more of switches 15a-15n to prevent liquid coolant from flowing into one or more pieces of IT equipment, 2) open one or more switches 25a-25n to prevent liquid coolant from flowing into the rack liquid manifold from one or more pieces of IT equipment, and/or 3) open one or more switches 42a-42n to cut the flow of current into the one or more pieces of IT equipment. Thus, the RMC 505 may perform any of the operations describe herein with respect to control device 6.

As described herein, the RMC may include a monitor to monitor operating status of various components within electronic rack 500, such as, for example, the pieces of IT equipment 7, CDU 3, and fan modules 531. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 14, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 14, such that the total power consumption of liquid pump 14 and fan modules 531 reaches minimum, while the operating data associated with liquid pump 14 and cooling fans of fan modules 531 are within their respective designed specifications. Once the optimal pump speed and optimal fan speeds have been determined, RMC 505 configures liquid pump 14 and cooling fans of fan modules 531 based on the optimal pump speed and fan speeds.

As an example, based on the optimal pump speed, RMC 505 communicates with a pump controller of CDU 3 to control the speed of liquid pump 14, which in turn controls a liquid flow rate of cooling liquid supplied to the liquid manifold 2 to be distributed to at least some of server blades 7. Therefore, the operating condition and the corresponding cooling device performance are adjusted. Similarly, based on the optimal fan speeds, RMC 505 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 7 may utilize different cooling methods. For instance, one server may utilize air cooling while another server may utilize liquid cooling. Alternatively, one IT component of a server may utilize air cooling while another IT component of the same server may utilize liquid cooling.

Figure 5:
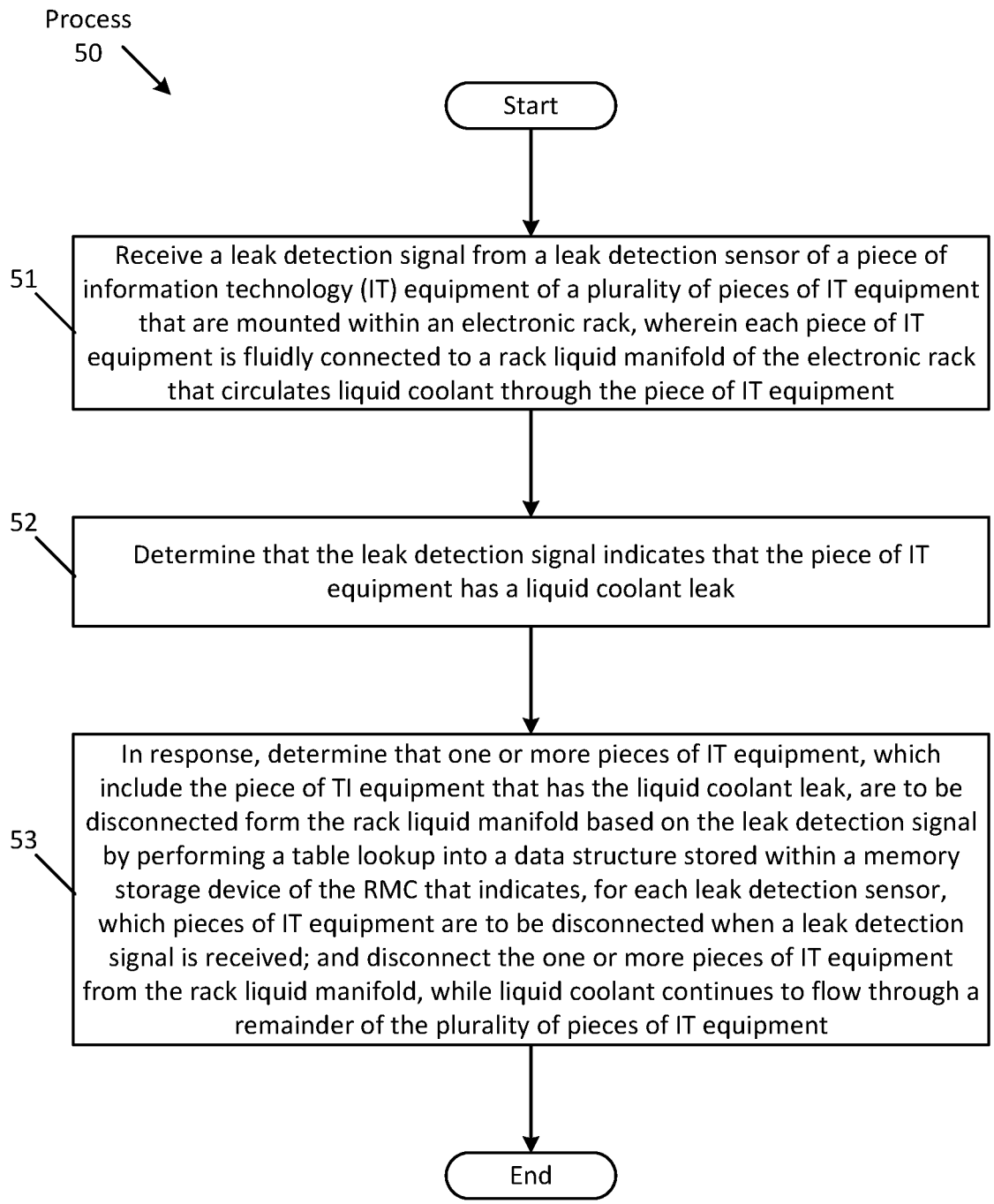
FIG. 5 is a flow chart of a process for controlling the flow of liquid coolant through pieces of IT equipment based on a detection of a liquid coolant leak according to one embodiment.

FIG. 5 is a flow chart of a process 50 for controlling the flow of liquid coolant through pieces of IT equipment based on a detection of a liquid coolant leak according to one embodiment. In one embodiment, at least some of the operations of the process 50 may be performed by the (e.g., control circuit 12 of the) RMC 505. The process 50 begins by the RMC receiving a leak detection signal from a leak detection sensor (e.g., at least one of sensors 9a-9n) of a piece of IT equipment of several pieces of IT equipment (e.g., 7a-7n) that are mounted within the electronic rack, where each piece of IT equipment is fluidly connected to the rack liquid manifold 2 of the electronic rack 500 that circulates liquid coolant through the piece of IT equipment (at block 51). The RMC determines whether the leak detection signal indicates that the piece of IT equipment has a liquid coolant leak (at block 52). Specifically, the control circuit 12 of the RMC determines whether the signal indicates that there is a leak based on the signal (e.g., whether the signal is in a high state, which indicates that a leak is detected, or a low state, which indicates that no leak is detected). In response to (e.g., the control circuit of the RMC) determining that the leak detection signal indicates that the piece of IT equipment has a liquid coolant leak, the (e.g., control circuit of the) RMC 1) determines that one or more pieces of IT equipment, which include the piece of IT equipment that has the liquid coolant leak, are to be disconnected from the rack liquid manifold based on the leak detection signal by performing a table lookup into a data structure stored within the memory storage device 11 of the RMC that indicates, for each leak detection sensor, which pieces of IT equipment are to be disconnected when a leak detection signal is received; and 2) disconnects the one or more pieces of IT equipment from the rack liquid manifold, while liquid coolant continues to flow through a reminder of the plurality of pieces of IT equipment (at block 53).

Some embodiments may perform variations to the process 50. For example, the specific operations of the process may not be performed in the exact order shown and described. The specific operations may not be performed in one continuous series of operations and different specific operations may be performed in different embodiments. For example, as described herein, the RMC may perform liquid and power management operations. Thus, along with disconnecting the one or more pieces of IT equipment from the rack liquid manifold, the RMC may disconnect the pieces of IT equipment from one or more DC busbars in order to power off the equipment as well. Specifically, the pieces of IT equipment may be electrically connected to the DC busbar, and in response to determining that the leak detection signal indicates that the piece of IT equipment has a liquid coolant leak, the (e.g., control circuit of the) RMC disconnects the one or more pieces of IT equipment from the DC busbar.

As described herein, the disconnecting of the liquid switches and the power switches may be performed at different times (e.g., in order to allow the pieces of IT equipment to continue to operate while the liquid coolant is drained out). Specifically, after disconnecting the one or more pieces of IT equipment from the supply manifold, the flow rate of the liquid coolant circulating through the rack liquid manifold is increased (e.g., by increasing the pump speed of liquid pump 14). After a period of time from which the flow rate of the liquid coolant has been increased, the pieces of IT equipment are disconnected from the DC busbar, as describe herein.

As previously explained, an embodiment of the disclosure may be (or include) a non-transitory machine-readable medium (such as microelectronic memory) having stored thereon instructions, which program one or more data processing components (generically referred to here as a "processor") to perform fluid and liquid management operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A control system for an electronic rack, the control system comprising:
    a rack management controller (RMC) that is communicatively coupled to a plurality of pieces of information technology (IT) equipment that are mounted within the electronic rack, each piece of IT equipment including a leak detection sensor and is fluidly couplable to a rack liquid manifold within the electronic rack that circulates liquid coolant through the piece of IT equipment;
    a plurality of adapters, each adapter configured to fluidly couple a piece of the plurality of pieces of IT equipment to the rack liquid manifold when connected to a busbar and fluidly decouple the piece of IT equipment from the rack liquid manifold when disconnected from the busbar;
    a plurality of switches, each switch is configured to connect and disconnect, from the busbar, a respective adapter of the plurality of adapters to control a flow of liquid coolant from the rack liquid manifold into a respective one piece of IT equipment of the plurality of pieces of IT equipment; and
    a control device that is communicatively coupled to the RMC and to the plurality of switches, and includes a memory storage device that has a data structure with a plurality of switch configurations for the plurality of switches,
    wherein, in response to the RMC not receiving a leak detection signal from a leak detection sensor, the control device is configured to set the plurality of switches in a first switch configuration of the plurality of switch configurations that allows liquid coolant to flow from the rack liquid manifold into each piece of IT equipment,
    wherein, in response to the RMC receiving a leak detection signal from a leak detection sensor of a piece of IT equipment, the control device is configured to:
        determine a second switch configuration from the plurality of switch configurations based on the leak detection sensor from which the leak detection signal is received, and
        set the plurality of switches according to the second switch configuration in which each of one or more switches of the plurality of switches, which includes a switch that controls the flow of liquid coolant into the piece of IT equipment, prevents liquid coolant from flowing from the rack liquid manifold into a respective piece of IT equipment.

2. The control system of claim 1, wherein each piece of IT equipment is not directly communicatively coupled with its respective switch that controls the flow of liquid coolant into the piece of IT equipment.

3. The control system of claim 1, wherein the memory storage device is removably coupled to the control device.

4. The control system of claim 1, wherein the busbar comprises a direct current (DC) busbar and each piece of IT equipment of the plurality of pieces of IT equipment includes a power switch that is communicatively coupled to the control device and is configured to electrically connect the piece of IT equipment to the DC busbar that supplies DC power when closed.

5. The control system of claim 4, wherein each switch configuration of the plurality of switch configurations indicates whether each switch of the plurality of switches and each power switch is open or closed, wherein, in response to the RMC receiving the leak detection signal from the leak detection sensor of the piece of IT equipment, the control device opens the one or more switches of the plurality of switches to prevent liquid coolant from flowing from the rack liquid manifold into respective one or more pieces of IT equipment, and opens one or more power switches of the respective one or more pieces of IT equipment.

6. The control system of claim 5, wherein the control device opens each power switch of the one or more power switches after a respective switch of the one or more switches is opened.

7. The control system of claim 6, wherein the electronic rack includes a coolant distribution unit (CDU) that is communicatively coupled with the RMC and includes a coolant pump that controls a flow rate of liquid coolant that circulates through the rack liquid manifold, wherein the RMC transmits a control signal to the CDU to increase the flow rate of the liquid coolant after the one or more switches are opened.

8. The control system of claim 1, wherein each of the plurality of switch configurations is based on workloads of the plurality of pieces of IT equipment, wherein each respective piece of IT equipment is performing at least a portion of a distributed workload.

9. The control system of claim 8, wherein the control device is configured to adjust the plurality of switch configurations based on changes to workloads of one or more pieces of IT equipment of the plurality of pieces IT equipment.

10. An electronic rack comprising:
    a rack liquid manifold having a supply manifold that receives liquid coolant from a coolant source and a return manifold that returns liquid coolant to the coolant source;
    a plurality of pieces of information technology (IT) equipment arranged in a stack for providing data processing services, each piece of IT equipment including a leak detection sensor and is fluidly couplable to the supply manifold and the return manifold to circulate liquid coolant through the piece of IT equipment;
    a rack management controller (RMC) that is communicatively coupled to each of the leak detection sensors;
    a plurality of adapters, each adapter configured to fluidly couple a piece of the plurality of pieces of IT equipment to the rack liquid manifold when connected to a busbar and fluidly decouple the piece of IT equipment from the rack liquid manifold when disconnected from the busbar; and
    a plurality of switches, each switch is communicatively coupled to the RMC and is configured to connect and disconnect, from the busbar, a respective adapter of the plurality of adapters to control a flow of liquid coolant from the rack liquid manifold into a respective piece of IT equipment of the plurality of pieces of IT equipment; and
    wherein the RMC includes a control circuit that has a memory storage device that includes a data structure with a plurality of switch configurations of the plurality of switches,
    wherein, in response to the RMC not receiving a leak detection signal from a leak detection sensor, the control circuit is configured to set the plurality of switches in a first switch configuration of the plurality of switch configurations that allows liquid coolant to flow from the rack liquid manifold into each piece of IT equipment, wherein, in response to the RMC receiving a leak detection signal from a leak detection sensor of a piece of IT equipment, the control circuit is configured to:
determine a second switch configuration from the plurality of switch configurations based on the leak detection sensor from which the leak detection signal is received, and
set the plurality of switches in a second switch configuration in which each of the one or more switches of the plurality of switches, which includes a switch that controls the flow of liquid coolant into the piece of IT equipment, prevents liquid coolant from flowing from the supply manifold into a respective piece of IT equipment.

11. The electronic rack of claim 10, wherein the memory storage device is removably coupled to the control circuit.

12. The electronic rack of claim 10, wherein the busbar comprises a direct current (DC) busbar that supplies DC power to the plurality of pieces of IT equipment, wherein each piece of IT equipment of the plurality of pieces of IT equipment includes a power switch that is communicatively coupled to the RMC and is configured to control a flow of current from the DC busbar into the piece of IT equipment.

13. The electronic rack of claim 12, wherein each switch configuration of the plurality of switch configurations indicates whether each switch of the plurality of switches and each power switch is open or closed, wherein in response to the RMC receiving the leak detection signal from the leak detection sensor of the piece of IT equipment, the control circuit opens the one or more switches of the plurality of switches and opens one or more power switches of the respective one or more pieces of IT equipment.

14. The electronic rack of claim 13, wherein the control circuit opens each power switch of the one or more power switches after a respective switch of the one or more switches is opened.

15. The electronic rack of claim 14 further comprises a coolant distribution unit (CDU) that is communicatively coupled to the RMC and includes a coolant pump that controls a flow rate of liquid coolant that circulates through the rack liquid manifold, wherein the RMC transmits a control signal to the CDU to increase the flow rate of the liquid coolant after the one or more switches are opened.

16. The electronic rack of claim 10, wherein each of the plurality of switch configurations is based on workloads of the plurality of pieces of IT equipment, wherein each respective piece of IT equipment of the one or more switches have a same workload.

17. The electronic rack of claim 16, wherein the control circuit is configured to adjust the plurality of switch configurations based on changes to workloads of one or more pieces of IT equipment of the plurality of pieces of IT equipment.

18. A method performed by a rack management controller (RMC) of an electronic rack, the method comprising:
receiving, by the RMC, a leak detection signal from a leak detection sensor of a piece of information technology (IT) equipment of a plurality of pieces of IT equipment that are mounted within the electronic rack, wherein each piece of IT equipment is fluidly connected to a rack liquid manifold of the electronic rack that circulates liquid coolant through the piece of IT equipment via a respective adapter, each respective adapter configured to fluidly couple a respective piece of IT equipment of the plurality of pieces of IT equipment to the rack liquid manifold when connected to a busbar and fluidly decouple the respective piece of IT equipment from the rack liquid manifold when disconnected from the busbar;
determining, by a control circuit of the RMC, whether the leak detection signal indicates that the piece of IT equipment has a liquid coolant leak;
in response to the control circuit determining that the leak detection signal indicates that the piece of IT equipment has a liquid coolant leak,
determining, by the control circuit, that one or more pieces of IT equipment, which include the piece of IT equipment that has the liquid coolant leak, are to be disconnected from the rack liquid manifold based on the leak detection signal by performing a table lookup into a data structure stored within a memory storage device of the RMC that indicates, for each leak detection sensor, which pieces of IT equipment are to be disconnected when a leak detection signal is received; and
operating, by the control circuit, one or more switches corresponding to the one or more pieces of IT equipment to disconnect one or more respective adapters corresponding to the one or more pieces of IT equipment from the busbar to cause the one or more respective adapters to disconnect from the rack liquid manifold, while liquid coolant continues to flow through a remainder of the plurality of pieces of IT equipment.

19. The method of claim 18, wherein the busbar comprises a direct current (DC) busbar and the plurality of pieces of IT equipment are electrically connected to the DC busbar that supplies DC power, wherein the method further comprises, in response to determining that the leak detection signal indicates that the piece of IT equipment has a liquid coolant leak, disconnecting, by the control circuit, the one or more pieces of IT equipment from the DC busbar.

20. The method of claim 19,
wherein the rack liquid manifold comprises a supply manifold that receives liquid coolant from a coolant source and a return manifold that returns liquid coolant to the coolant source, wherein the plurality of pieces of IT equipment are connected to the supply manifold and the return manifold, wherein disconnecting the one or more pieces of IT equipment comprises disconnecting each of the one or more pieces of IT equipment from the supply manifold,
wherein the method further comprises after disconnecting the one or more pieces of IT equipment from the supply manifold, increasing a flow rate of liquid coolant circulating through the rack liquid manifold,
wherein the one or more pieces of IT equipment are disconnected from the DC busbar a period of time after the flow rate of the liquid coolant has been increased.

* * * * *